United States Patent [19]
Okino

[11] Patent Number: 5,874,198
[45] Date of Patent: Feb. 23, 1999

[54] CHARGED PARTICLE BEAM TRANSFER METHOD

[75] Inventor: Teruaki Okino, Kamakura, Japan

[73] Assignee: Nikon Corporation, Tokyo, Japan

[21] Appl. No.: 742,016

[22] Filed: Oct. 31, 1996

[30] Foreign Application Priority Data

Nov. 1, 1995 [JP] Japan .................................... 7-284838

[51] Int. Cl.$^6$ .............................. G03C 5/00; A61N 5/00
[52] U.S. Cl. .............................. 430/296; 430/5; 430/942; 250/492.3
[58] Field of Search .............................. 430/5, 296, 942; 250/492.3

[56] References Cited

U.S. PATENT DOCUMENTS

| | | | |
|---|---|---|---|
| 4,282,437 | 8/1981 | Boie ................................... | 250/492 A |
| 4,989,156 | 1/1991 | Ikenaga ................................... | 364/488 |
| 5,079,112 | 1/1992 | Berger et al. ............................... | 430/4 |
| 5,130,213 | 7/1992 | Berger et al. ............................... | 430/4 |
| 5,260,151 | 11/1993 | Berger et al. ............................... | 430/5 |
| 5,523,580 | 6/1996 | Davis ................................... | 250/505.1 |

FOREIGN PATENT DOCUMENTS 5-36593  12/1993  Japan .

*Primary Examiner*—Janet Baxter
*Assistant Examiner*—Rosemary Ashton

*Attorney, Agent, or Firm*—Klarquist Sparkman Campbell Leigh & Whinston, LLP

[57] ABSTRACT

A charged particle beam transfer method is disclosed for use in lithography processes, particularly in processes for the manufacture of semiconductor integrated circuits. A mask pattern is divided into multiple mask subfields separated from one another by a grid of boundary fields. The multiple mask subfields are preferably arrayed in a matrix of rows and columns, which are irradiated with a charged particle beam. Irradiation of the mask subfields transfers the image of each mask subfield to a transfer field on a sensitive substrate, such as the surface of a silicon wafer used in the manufacture of integrated circuits. The position of the transfer fields are adjusted so that the transfer subfields touch each other on the substrate, without being separated by the border fields. Irradiation of the multiple mask subfields is performed in the direction of the columns, in the direction of the rows, or a combination thereof. Some of the mask subfields are arrayed within a limited range on the mask, and are sequentially and cyclically irradiated multiple times to transfer multiple copies of the mask field in the limited range on to the substrate. Within a limited range the particle beam is moved electrostatically, while outside the limited range the beam is moved electromagnetically. Desired transfer images may be divided into multiple complementary mask fields, which are transferred to a single transfer field to from the complete image.

21 Claims, 11 Drawing Sheets

CHARGED PARTICLE BEAM TRANSFER METHOD

FIELD OF THE INVENTION

This invention pertains to a charged particle beam transfer method used in lithography processes for the manufacture of semiconductor integrated circuits and the like. More specifically, the invention pertains to a charged particle beam transfer method which transfers a pattern from a mask onto a sensitive substrate by a divided transfer method, using a charged particle beam, such as an electron beam or ion beam.

BACKGROUND OF THE INVENTION

Advances with charged particle beam transfer devices as used for making integrated circuits and related devices have made it possible to achieve both improved transfer pattern resolution and improved throughput (productivity) in recent years. One such device that has been investigated in the past uses a one-shot transfer system that transfers one die (meaning an entire pattern for one of multiple integrated circuits formed on a single wafer) or multiple dies' worth of patterns from a mask onto a sensitive substrate in a single exposure ("shot"). However, with one-shot transfer systems, the masks which comprise the transfer original are difficult to make, and it is difficult to keep aberrations in the charged particle optical system (hereinafter referred to simply as the "optical system") to below a desired value inside of a large optical field of one die or greater. Therefore, devices using divided transfer systems have recently been studied which divide the pattern which is to be transferred onto the sensitive substrate into multiple subfields, each subfield being smaller than the size of one die.

FIG. 13 shows an example of an electron beam reducing transfer device using a conventional divided transfer system. An electron beam EB propagating from an electron beam source (not shown), having a cross section having a square shape, is deflected a set distance δ from the optical axis AX of the optical system by a deflecting system (not shown) and guided to one of the multiple mask subfields 2a situated in a mask 2. The mask subfield 2a is an area that includes an electron-beam transmitting area corresponding with the pattern shape that is to be transferred onto the wafer 5. Each of these mask subfields 2a is separated from one another by a boundary field 2b that either blocks or scatters the electron beam.

The electron beam EB, having passed through the mask subfield 2a, passes through a first projection lens (not shown) and converges once at a crossover (electron beam source image) CO, after which the beam passes through a second projection lens (not shown). The beam is focused on a single transfer subfield 5b on the wafer 5 to which an electron beam resist has been applied, as the sensitive substrate. Thus, the image of the pattern in the mask subfield 2a is projected at a desired reduction ratio (e.g., ¼) onto the transfer subfield 5b. In FIG. 13, the Z axis is drawn parallel with the optical axis AX, and the X axis and Y axis are drawn parallel to the two orthogonal edges of the mask subfield 2a, inside the plane that is perpendicular to the Z axis.

During transfer of the entire pattern on the mask 2, irradiation of the electron beam EB is repeated using the mask subfield 2a as a unit, and reduced images of the patterns on the mask subfields 2a are sequentially transferred to separate transfer subfields 5b on the wafer 5. The position of each transfer subfield 5b on the wafer 5 is determined by a beam-deflecting system (not shown) which is situated in the optical path between the mask 2 and the wafer 5 so that the transfer subfields 5b, individually corresponding with a separate respective mask subfield 2a, touch each other. The electron beam EB that has passed through the mask subfield 2a is focused onto the wafer 5 by means of a first projection lens and a second projection lens (not shown). The image of not only the mask subfield 2a is projected, but also that of the boundary field 2b, which is transferred at a desired reduction ratio, creating an unexposed area corresponding with the boundary field 2b between each transfer subfield 5b. Therefore, the transfer positions of the pattern images are shifted only by a width corresponding to the boundary field 2b.

Once the pattern images corresponding with all of the mask subfields 2a of a mask 2 have been transferred, the transfer of patterns comprising one die's worth 5a of transfer subfields 5b on the wafer 5 is completed. During this time, transfer is performed while correcting any aberrations, etc., such as the focal position of the subfield image which is formed on the transfer reception field for each subfield, or field distortion, etc. Thus, transfers of excellent resolution and accuracy can be accomplished across an optically wider field than with one-shot transfer systems. Japan Kokai Patent Application Publication No. HEI 5-36593 discloses a method of forming a mask subfield that corresponds with a repetitious pattern, such as memory cells, and then repeatedly transferring the image of this subfield to multiple locations on a wafer. Such a scheme uses a variable shaping aperture, without independently producing patterns other than the repetitious pattern on the mask. Unfortunately, throughput is very low with such a scheme.

In the divided transfer method described above in connection with FIG. 13, there is a 1:1 correlation between the mask subfields 2a on the mask 2 and the transfer subfields 5b on the wafer 5. For example, when one die's worth 5a consists of 100 transfer subfields 5b, there are 100 corresponding mask subfields 2a in the mask 2. In order to reductively transfer the patterns from the mask 2 to the wafer 5, the size of a single mask subfield 2a is the size of a single corresponding transfer subfield 5b magnified by the reciprocal of the reduction ratio. In addition, boundary fields 2b are also situated in the mask along with the mask subfields 2a. Consequently, the size of the range 2P in which the mask subfields 2a are situated on the mask (hereinafter referred to as the "pattern field") is always larger than the total surface area of the subfields on the mask 2 corresponding to all of the transfer subfields 5b on the wafer. In the present explanation (including FIG. 13), the pattern field 2P and the transfer subfields 5b are seen as corresponding with one die's worth. Ordinarily, δ cannot be longer than one side of one die because otherwise large optical aberrations would be introduced. Therefore, one die is divided into multiple "stripes," and the position of each stripe is determined by movement of the stage.

In an electron beam transfer device, the more the electron beam irradiation position is separated from the optical axis AX of the optical system, the greater the possible aberration imparted by the optical system. In other words, the greater the deflection amount δ shown in FIG. 13, the greater optical errors in resolution, etc., will become. When considering the range in which optical errors are kept within the tolerance range on the mask side and on the wafer side, both ranges are considered to be circular areas centered around the optical axis AX of the optical system on both the mask surface and the wafer surface. Herein, the range in which optical errors are kept within the tolerance range on the mask side will be referred to as the "mask-side optical field" Cm, and the range in which optical errors are kept within the tolerance range on the wafer side will be referred to as the "sensitive substrate-side optical field" Cw.

In the case of reductive transfer, because the mask-side optical field Cm is considerably larger than the sensitive substrate-side optical field Cw, the size of the pattern field 2P on the mask 2 and of the corresponding transfer field 5a on the wafer 5 are limited by the size of the mask-side optical field Cm. In other words, even if there is surplus optical field on the wafer side, the pattern can be transferred to no more than a limited smaller range. Consequently, the optical field on the wafer should be set small, and the number of stripes increased. Such a scheme decreases throughput. As a result, the percentage of the total process time taken up by stage driving time to move the wafer 5 increases, thereby decreasing throughput. Throughput is greatly decreased especially during stage return (when changing drive directions), when nonproductive time increases due to the accumulation of overhead time.

Therefore, a system has been considered to prevent this kind of decrease in throughput in which, in several of the mask subfields, multiple subfields with the same pattern are arranged in a single subfield and the pattern in the single subfield is repeatedly transferred to multiple transfer subfields on the wafer. The kind of mask in which common patterns are thus arranged is called a "compressed mask."

Especially when transferring patterns having many common circuit patterns, as with, e.g., dynamic random access memory (DRAM), the mask can be made smaller by one or more orders by performing transfer by a divided transfer system using a compressed mask. This eliminates the need to move the mask at high speeds during transferring. However, if the arrangement of the pattern and the transfer sequence of the patterns are not considered when using a compressed mask, the amount of movement by the deflecting system (deflection movement amount) may become excessively great when, e.g., moving from one mask subfield to the next mask subfield. Problems arise as the amount of deflection movement increases between subfields when this kind of continuous transfer is being performed because longer settling time is required for the deflection system, which results in decreased throughput.

When a compressed mask is used, the pattern in a single mask subfield is repeatedly transferred, over and over, to many different transfer subfields on the wafer. However, the repeatedly transferred mask subfield is irradiated by the charged particle beam many times in succession, which increases the temperature of that subfield and causes decreased positional accuracy of the pattern within that subfield due to the resulting thermal expansion of the mask substrate.

Consideration has been given to controlling such temperature increases resulting from repeated charged particle beam irradiation of a single mask subfield. Multiple adjacent subfields with the same pattern can be formed, and these adjacent multiple subfield patterns are sequentially irradiated over multiple cycles. However, there are problems with this cyclical irradiation of multiple subfields in that it invites decreases in throughput due to increased deflecting-system settling time compared to using a single subfield. This is particularly true when an electromagnetic deflecting system is used, which requires long settling times, further lengthening the overall settling time. (Electromagnetic deflecting systems are normally used rather than electrostatic deflecting systems in order to decrease aberration when performing large deflection. The use of an electrostatic deflecting system for all of the mask subfields presents aberration problems.)

In addition, in order to easily manufacture masks, it is advantageous if the boundary fields 2b that separate the mask subfields 2a form a regular grid. Furthermore, since the charged particle beam irradiation area of the various mask subfields is constant, when the size of the mask subfields changes within a single mask, it becomes impossible to irradiate the entire surface of the pattern inside each mask subfield, and there is the danger that the adjacent subfield will be simultaneously irradiated. In addition, there are cases in which it is difficult, e.g., to distribute the originals of multiple various patterns with different repetition pitches into various different mask subfields of the same size.

Furthermore, when transferring a pattern using a charged particle beam such as an electron beam or ion beam, so-called Coulomb effect blurring occurs due to the repulsion between the charged particles, causing a blurring phenomenon in the transferred image. This effect limits the current density that can be used during transfer. Therefore, the current density during transfer to the wafer must be limited using, as a standard, the transfer subfield on the wafer that received the greatest amount of irradiation. When this is done, there are many subfields in which a surplus of electrical current could be used but is not used, presenting the problems of lengthened irradiation time and an inability to increase throughput.

This invention addresses these problems, and has as its first object to provide a charged particle beam transfer method which is able to shorten the spaces between subfields which are continuously transferred on a mask when performing transfer by a divided transfer system using a compressed mask, thereby improving throughput.

A second object of this invention is to provide a charged particle beam transfer method which, when performing transfer by a divided transfer system using a compressed mask, prevents irradiation of the charged particle beam for long periods of time on a specified mask subfield, thereby enabling the positional accuracy of the pattern being transferred to be maintained at a high level.

A third object of this invention is to provide a charged particle beam transfer method which, when performing transfer by a divided transfer system, is able to perform deflection of the charged particle beam at high speeds during cyclical transferring of the patterns in multiple adjacent mask subfields, and is able to perform deflection of the charged particle beam between separated subfields with a high level of accuracy.

A fourth object of this invention is to provide a charged particle beam transfer method that, when performing pattern transfer by a divided transfer system using a compressed mask, performs compressing the pattern to fewer mask subfields and projecting them, even for multiple types of cyclical patterns with different repetition pitches on the sensitive substrate.

A fifth object of this invention is to provide a charged particle beam transfer method that, when performing pattern transfer by a divided transfer system, eliminates mask subfields in which there is a particularly large amount of irradiation from the charged particle beam, hence making it possible to prevent blurring due to the Coulomb effect without excessively decreasing throughput.

These and other objects of the invention will be better understood by reference to the following summary and detailed description of the invention.

SUMMARY OF THE INVENTION

A first charged particle beam transfer method of this invention pertains to a method in which, e.g., as shown in FIGS. 2(a) and 2(b), a pattern to be transferred to a specified range 60Q on a sensitive substrate 60 is formed with at least part of the pattern divided into multiple subfields ($SF_{1,1}$, $SF_{1,2}$, ...) separated from one another on a mask 50. A charged particle beam is irradiated onto the mask 50 using the mask subfields as irradiation units, at which time multiple irradiations are performed on at least some of the mask subfields $SF_{1,2}$. This irradiation thereby transfers the patterns in multiple different transfer subfields $PF_{1,2}$, $PF_{1,4}$ onto the sensitive substrate 60. Also, a desired pattern is transferred in a specified range 60Q on the sensitive substrate 60 by adjusting the pattern transfer position onto the sensitive substrate 60 so that the transfer subfields ($PF_{1,1}$, $PF_{1,2}$, ...) corresponding to the mask subfields touch each other on the sensitive substrate 60.

FIGS. 3(a)–3(c) and 4–5 illustrate a method according to the invention in which the charged particle beam is sequentially irradiated on the mask subfields $P_{1,1}$–$P_{1,18}$; $P_{2,1}$–$P_{2,18}$; $P_{3,18}$–$P_{3,11}$ arrayed in one direction (Y direction), where one line or multiple lines within a limited range 51P on the mask is/are considered as one unit. The charged particle beam sequentially transfers a corresponding single line or multiple lines of mask subfields to subfields $Q_{1,1}$–$Q_{1,18}$ on the sensitive substrate, in the same direction as the array direction of the mask subfields. The method also sequentially transfers one line or multiple lines of the transfer subfields $Q_{2,18}$–$Q_{5,18}$ to the sensitive substrate in the direction perpendicular to the array direction of the mask subfields.

With this invention, a circuit block 61A comprising a non-repetitious peripheral circuit 62 and repetitious memory cells 63A, 63B, as shown in FIG. 3 (b), can be transferred onto a sensitive substrate. The original pattern, corresponding with the transfer subfields $Q_{1,1}$–$Q_{1,18}$ for the peripheral circuits arrayed in the vertical direction (Y direction) on the sensitive substrate in FIG. 5, is formed on the mask in FIG. 4 in subfields $P_{1,1}$–$P_{1,18}$, $P_{2,1}$–$P_{2,18}$ that are also arrayed in the Y direction using, e.g., two columns as a unit. In addition, the original pattern corresponding with the transfer subfields $Q_{2,18}$–$Q_{5,18}$ for the peripheral circuits arrayed on the sensitive substrate in the horizontal direction (this shall be the X direction) is formed by the mask subfields $P_{3,18}$–$P_{3,11}$ that are arrayed in the Y direction using, e.g., one column as a unit. The transfer sequence is performed in the sequence of the track 55 on the mask, and in the sequence of the track 64 on the sensitive substrate. In this manner, the majority of deflecting movement is to the adjacent mask subfields or transfer subfields on both the mask and the sensitive substrate, respectively, so that transfer exposure can be performed without the deflection settling time being excessively long, even in transfer exposure systems that use a mask in which the subfields have been compressed.

According to another aspect of this invention, a charged particle beam transfer method is provided in which, as shown in FIG. 2, a pattern to be transferred to a specified range 60Q on a sensitive substrate 60, is formed with at least part of the pattern divided into multiple complementary subfields ($SF_{1,1}$, $SF_{1,21}$, ...) separated from one another on a mask 50. A charged particle beam is repeatedly irradiated onto the mask 50 using these subfields as irradiation units. The desired pattern is transferred in a specified range 60Q on the sensitive substrate 60 by adjusting the pattern transfer position onto the sensitive substrate so that the multiple transfer subfields ($PF_{1,1}$, $PF_{1,2}$, ...) on the sensitive substrate 60, corresponding to the multiple mask subfields, touch each other on the sensitive substrate.

In addition, as shown in FIGS. 4–5, when the mask subfields $P_{3,10}$–$P_{6,10}$, $P_{6,9}$–$P_{3,9}$ arrayed within a limited range on the mask are sequentially and cyclically irradiated multiple times with a charged particle beam, a pattern is sequentially transferred onto a number of transfer subfields ($Q_{5,17}$–$Q_{5,2}$) on the sensitive substrate that is greater than the number of the mask subfields within the limited range.

In a case where a single mask subfield is transferred to multiple transfer subfields on a sensitive substrate, the mask subfield could potentially be irradiated with the charged particle beam for a long period of time. Prolonged irradiation of a mask subfield can be avoided, in accordance with the present invention, by providing identical adjacent subfields on the mask that can be sequentially and cyclically irradiated. In FIG. 4, for example, not only one, but several mask subfields $P_{3,10}$–$P_{6,10}$, $P_{6,9}$–$P_{3,9}$ of the same pattern are made on the mask and used cyclically and repeatedly. By doing this, the temperature of each mask subfield is increased temporarily by irradiation, but the heat is dissipated by the time of the next irradiation, so that there is virtually no difference from the temperature increase of a mask subfield that is irradiated only once. Consequently, there is no decrease in pattern positioning accuracy due to thermal expansion in the mask subfield.

In accordance with a third aspect of this invention, as shown in FIG. 8, when a pattern is being transferred multiple times onto the sensitive substrate, by sequentially and cyclically irradiating the corresponding multiple mask subfields $SF_{1,1}$–$SF_{3,3}$ arrayed within a limited range on the mask, the charged particle beam is deflected by an electrostatic deflecting system. An electromagnetic deflecting system is used to deflect the charged particle beam outside the limited range, when sequential and cyclic irradiation of mask subfields within the limited range is not required.

Normally, from the viewpoint of decreasing aberration, an electromagnetic deflecting system is used rather than an electrostatic deflecting system to perform large deflections. On the other hand, electromagnetic deflection requires a relatively long settling time, while electrostatic deflection has a short settling time, on the order of 1/10 to 1/100 that of electromagnetic deflection. Therefore, in this invention, when multiple subfields are repeatedly irradiated in order to prevent temperature increases in the mask or sensitive substrate, an electrostatic deflecting system is used. An electromagnetic deflecting system can be used for deflection outside of this range. Thus, both accuracy and throughput can be improved by using an electrostatic deflecting system to perform repetitive irradiation of multiple subfields within a certain limited range.

A fourth aspect of this charged particle beam transfer method is illustrated by FIGS. 2(a)–2(b), wherein the boundary fields BF that surround the mask subfields ($SF_{1,1}$, $SF_{1,2}$, ...) are regularly arrayed in a grid pattern. The pattern fields within the mask subfields are independently set for each of the subfields, and the transfer subfields ($SF_{1,1}$, $SF_{1,2}$, ...) corresponding with the aforementioned mask subfields are set in any position on the sensitive substrate. The shaded mask subfield shown in FIG. 2(a) can appear in multiple positions on the sensitive substrate in FIG. 2(b) without requiring a one-to-one correspondence between the overall pattern of the mask fields and the overall pattern of the transfer fields.

With this invention, particularly when transferring a specific repetitious pattern to multiple transfer subfields on a sensitive substrate using a single mask subfield, there are multiple possible types of repetitious patterns rather than just one, and the repetition pitches of the various patterns may differ. For example, FIG. 9(a) shows a repeating pattern based on an X2×Y2 wide pattern 65 and FIG. 9(b) shows a repeating pattern based on an X3×Y3 wide pattern 66. If the width Y3 is greater than the widths X2, Y2 and X3, then the mask subfields are set to a Y3×Y3 size. Thus, the pattern arrangement within each mask subfield can be the same as each other mask subfield, as with pattern 65 or 66, or smaller than that, even though each mask subfield usually has the same dimensions.

The foregoing means that the pattern will have a cyclical shape. (I.e., a certain primitive pattern is repeated cyclically and the repetition generates the pattern. The pattern on the mask is generated by the repetition of a repeating pattern on the wafer with the original period or with a period multiplied by an integer.) Thus, when performing exposure transfer to the sensitive substrate, positioning of the pattern on the sensitive substrate will be performed by means of the deflecting system according to the design pattern. This method makes it possible to perform efficient transfer exposure of repeating patterns. This is likewise true for non-repetitious patterns.

A fifth aspect of the method of this invention is illustrated in FIG. 10. In cases wherein the charged particle beam irradiation intensity in the specified mask subfield exceeds a specified amount, a single pattern 67 can be distributed as complementary patterns in two mask subfields 56A, 56B on the mask. The pattern 67 which is to be transferred to the transfer subfields can alternatively be divided into a number of mask subfields (such as the three fields 56C–56E) which is greater than the aforementioned case so that the irradiation intensity does not exceed the desired level. The divided mask subfields are overlaid on the sensitive substrate during transfer, by sequential particle beam irradiation of the mask subfields, so as to form the original pattern on a single transfer field.

For example, when a perforated stencil mask is used, it may be necessary to divide the pattern into two complementary subfields. In contrast, in the case of a scattering mask, this division would not be necessary. When the pattern density is high for a certain divided mask subfield in the perforated stencil mask, or a particular mask subfield in the case of a scattering mask, there are problems with Coulomb effect blurring, When such blurring is not a problem with many of the other subfields, transfer exposure would conventionally have been performed by decreasing the current density of the transfer device. However, when this is done, throughput efficiency is poor. Therefore, for only the mask subfields as described above, in the case of perforated stencil masks, the mask subfields are divided into not two, but three, while in the case of scattering masks, mask subfields are divided into two or more. These are then transferred overlaid during transferring. Thus, transferring can be performed with high efficiency, without decreasing the current density.

BRIEF DESCRIPTION OF THE DRAWINGS

FIGS. 10(a)–10(d) provide explanatory drawings illustrating how a single pattern that is divided into patterns in three subfields is transferred.

DETAILED DESCRIPTION OF THE PREFERRED EMBODIMENTS

An embodiment of the charged particle beam transfer method of this invention will be explained with reference to FIG. 1 through FIG. 12. The examples set forth in this specification illustrate the transfer method in association with an electron-beam reducing transfer device using a divided transfer system.

Figure 1:
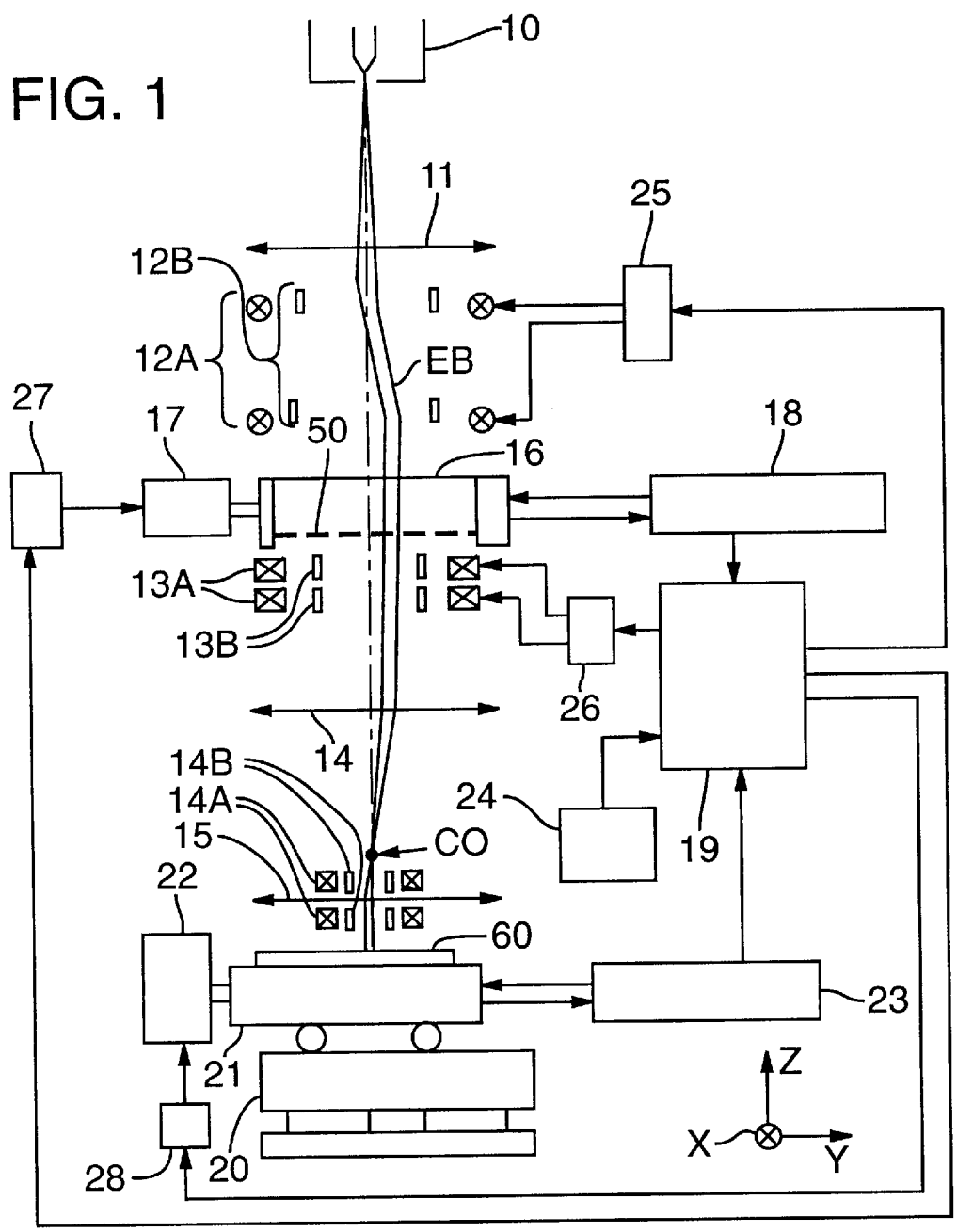
FIG. 1 is a schematic elevational drawing certain features of an electron beam reducing transfer device used to perform a method according to the invention.

FIG. 1 shows the general configuration of the electron beam reduction transfer device of this example, wherein a Z axis is drawn parallel with the axis of the optical system (electron optical system), an X axis is drawn perpendicular to the page and orthogonal to the Z axis, and a Y axis is drawn orthogonal to the X and Z axes. The electron beam EB emitted from an electron gun 10 is made into a parallel beam by a condenser lens 11, and is guided to a single mask subfield on the mask 50 by being deflected within the XY plane by the field-selection deflectors 12A, 12B. The field-selection deflector 12A is preferably electromagnetic, and the field-selection deflector 12B is preferably electrostatic. Normally the electromagnetic field-selection deflector 12A is used. The electrostatic field-selection deflector 12B is preferably used when repeatedly moving the electron beam at high speeds within a narrow range. (I.e., a condition satisfying the following: (a) any deflection aberration arising in an electrostatic deflector is at the same level or less than such aberration arising in an electromagnetic deflector; (b) the voltage used to drive the deflector is realistic; and (c) the settling time is shorter than that of an electromagnetic deflector.)

The electron beam EB that has passed through the mask 50 is deflected a desired amount by the deflectors 13A, 13B and focused at a crossover CO by a projection lens 14. The beam is converged by an objective lens 15 and deflectors 14A, 14B on the wafer 60 to which electron beam resist has been applied. Thus, the image of one mask subfield is transferred at a desired reduction ratio (e.g., ¼) to a desired location (transfer subfield) on the wafer 60. The deflectors 13A, 14A are preferably electromagnetic and the deflectors 13B, 14B are preferably electrostatic. Normally the electromagnetic deflectors 13A, 14A are used; the electrostatic deflectors 13B, 14B are used when repeatedly moving the electron beam at high speeds within a narrow range.

The mask 50 is mounted parallel with the XY plane on a mask stage 16. The mask stage 16 is moved continuously in the X direction and step-wise in the Y direction by a drive 17. The position of the mask stage within the XY plane is detected by a laser interferometer 18 which produces signals that are output to a controller 19.

The wafer 60 is held parallel to the XY plane on a movable stage 21 on top of a specimen base 20. The movable stage 21 can be moved continuously in the direction opposite the continuous movement in the X direction of the mask stage 16. The reason that it is moved in the opposite direction is that the pattern image is inverted by the lenses 14, 15. The position of the movable stage within the XY plane is detected by a laser interferometer 23 which produces a signal output to the controller 19.

The controller 19 calculates the amounts that the electron beam EB is deflected by the field-selection deflectors 12A, 12B and the deflectors 13A, 13B, 14A, 14B. The controller 19 also calculates data required to control movement of the mask stage 16 and the movable stage 21 (e.g., position and velocity) based on exposure data from an input device 24 as well as position data for the mask stage 16 and movable stage 21 from the laser interferometers 18, 23.

The results from calculating the deflection amounts are output to deflection-amount-setting devices 25, 26. The deflection-amount-setting devices 25, 26 set the deflection amounts for the field-selection deflectors 12A, 12B and the deflectors 13A, 13B, 14A, 14B, respectively.

The calculation results regarding movement of the stages 16, 21 are output to the respective driver controllers 27, 28. The driver controllers 27, 28 control the movement of the drivers 17, 22 so as to move the stages 16, 21 according to the calculation results.

The input device 24 can be appropriately selected from any of various devices that read, for example, magnetic data produced by an exposure data preparation device, or one which reads exposure data that have been recorded on the mask 50 or wafer 60 when either is loaded.

Figure 2A:
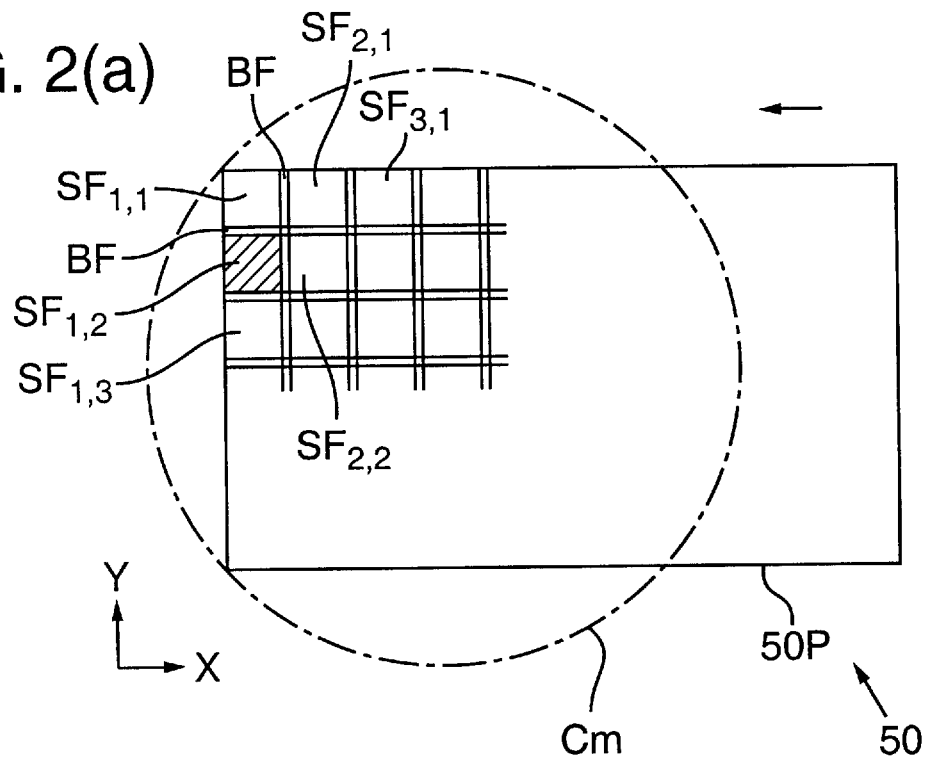
FIG. 2(a) is a plan-view drawing showing an example of the subfield array on a mask.

FIG. 2(a) shows an example specified pattern field 50P of a mask, the pattern field 50P comprising multiple mask subfields. In this example, the pattern field 50P is larger in the direction of the X axis than the optical field Cm on the mask side of the electron beam irradiation optical system. The pattern field 50P is divided into square mask subfields $SF_{1,1}$, $SF_{1,2}$, ..., $SF_{2,1}$, ... at desired pitches in the X direction and Y direction. The mask subfields $SF_{i,j}$ (i=1, 2, ...; j=1, 2, ...) are separated from one another by boundary fields BF that either block or scatter the electron beam. Electron beam transmitting areas that correspond with the pattern to be transferred to the wafer are situated in the mask subfields $SF_{i,j}$.

Figure 12A:
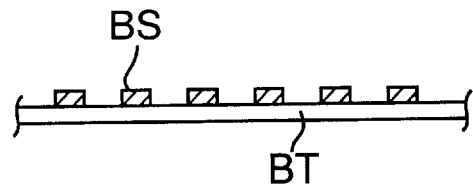
FIG. 12(a) is a cross-sectional fragmentary drawing showing a scattering mask.
Figure 12B:
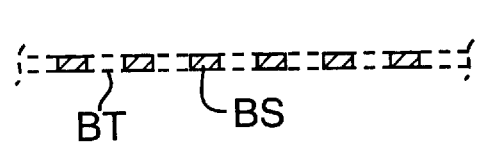
FIG. 12(b) is a cross-sectional fragmentary drawing showing a perforated stencil mask.
Figure 13:
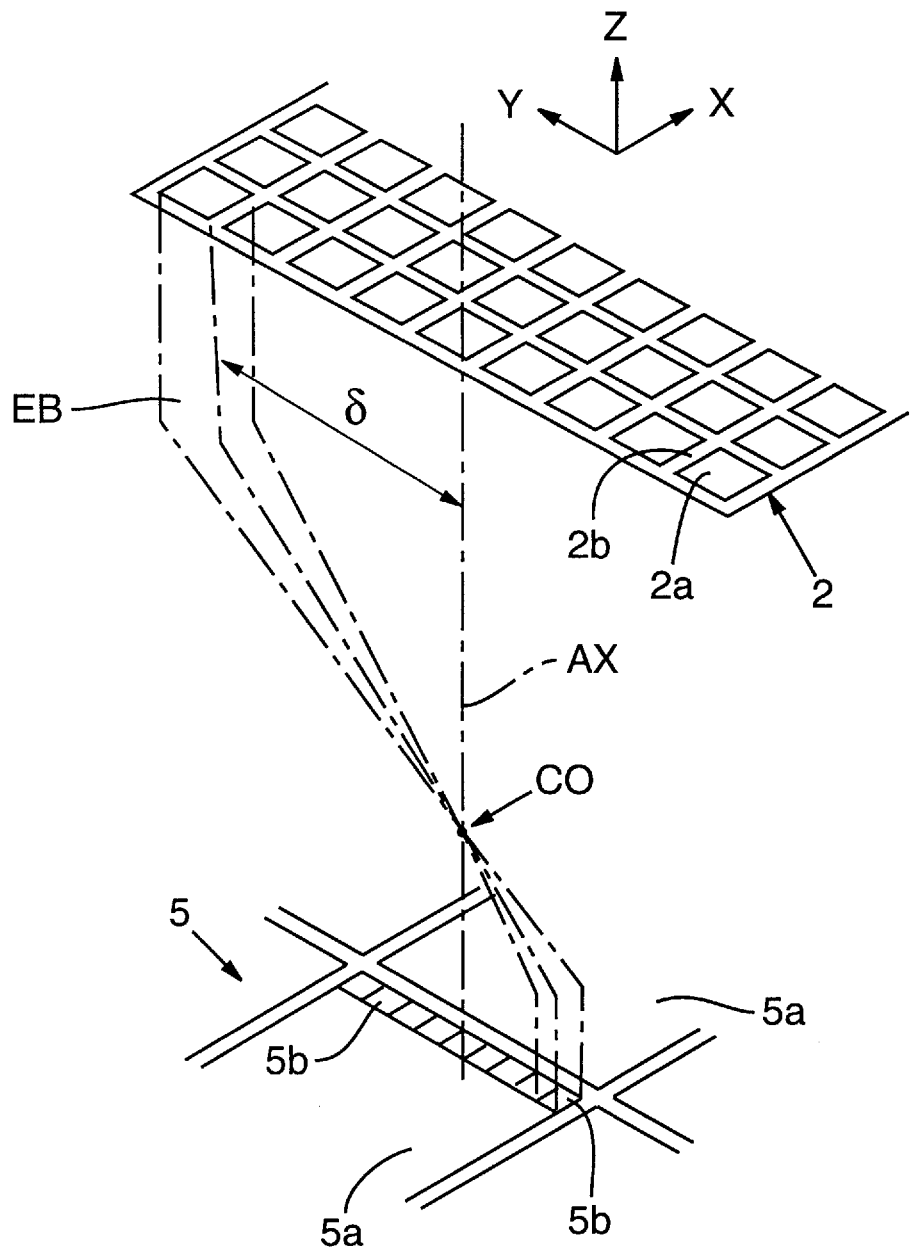
FIG. 13 is a schematic oblique-view drawing showing a prior art divided transfer-type electron beam reducing transfer device.
Figure 14A:
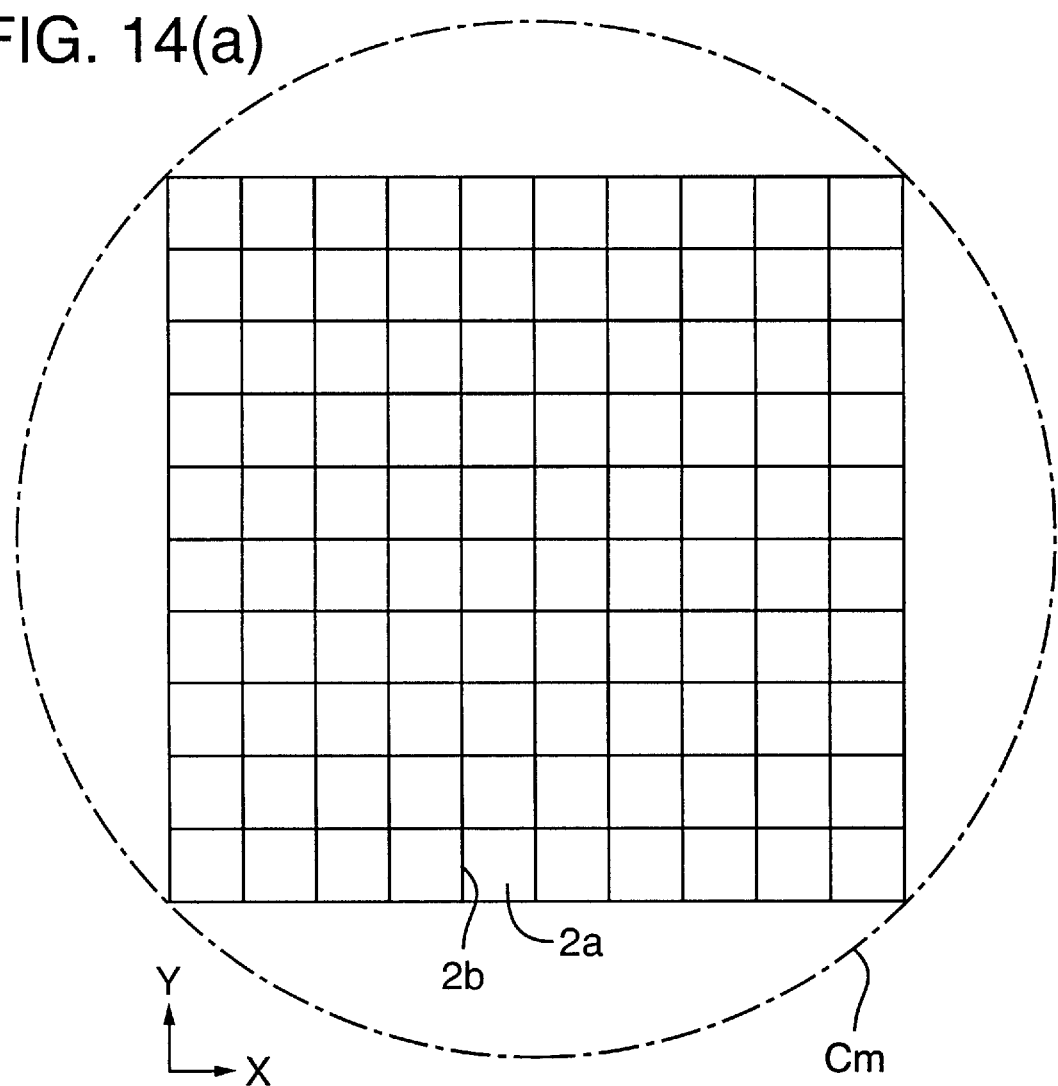
FIGS. 14(a)–14(b) provide drawings showing an example of the one-to-one correlation between the mask subfields (FIG. 14(a)) and the transfer subfields on the wafer (FIG. 14(b)).
Figure 14B:
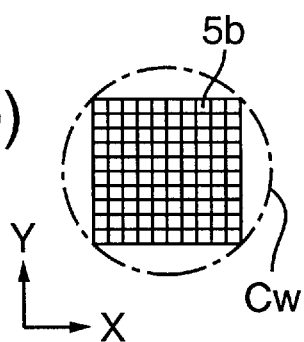

Examples of the electron beam transfer mask 50 include a so-called scattering mask, e.g., as shown in FIG. 12(a), and a so-called perforated stencil mask, e.g., as shown in FIG. 12(b). In the scattering mask of FIG. 12(a), transmitting areas BT are formed as a thin film of silicon nitride (SiN), on the surface of which are situated suitable tungsten scattering areas BS. In the perforated stencil mask of FIG. 12(b), voids situated in a silicon (Si) scattering part BS act as the electron beam transmitting parts BT. Either type of mask can be used in the method of the present invention.

Figure 2B:
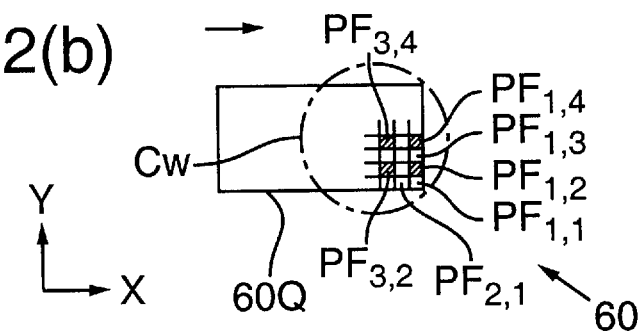
FIG. 2(b) is a plan-view drawing showing an example of the transfer subfield array, corresponding to the subfield array of FIG. 2(a), on a wafer.

FIG. 2(b) shows the transfer field 60Q of, e.g., approximately one fraction of one die on the wafer 60 in this example. The transfer field 60Q is divided in the X direction and the Y direction into square transfer subfields $PF_{1,1}$, $PF_{1,2}$, ..., $PF_{2,1}$, ..., the size of which transfer subfields $PF_{i,j}$ (i=1, 2, ...; j=1, 2, ...) is set to β×the subfield $SF_{i,j}$ on the mask 50, where β is the reduction ratio from the mask 50 to the wafer 60 (e.g., ¼). Adjacent transfer subfields $PF_{i,j}$ are tightly linked without any space which corresponds to the boundary field BF on the mask 50.

The transfer field 60Q is set so that it is larger in the direction of the X axis than the optical field Cw on the sensitive substrate side. By using the deflecting system to scan the pattern image of the mask subfield $SF_{i,j}$ within the pattern field 50P on the mask 50 in FIG. 2(a), and within the optical field Cm on the mask side, the pattern can be transferred to the transfer subfield $PF_{i,j}$ within the transfer field 60Q on the wafer 60 in FIG. 2, and within the optical field Cw on the sensitive substrate side. In this example, when the pattern being transferred to the transfer field 60Q on the wafer 60 is divided into mask subfields $SF_{i,j}$, those mask subfields in which the pattern shape is the same after division are collected into an appropriate common mask subfield. For example, assuming that the patterns to be transferred to transfer subfields $PF_{1,2}$, $PF_{1,4}$, $PF_{3,2}$, and $PF_{3,4}$ inside the transfer field 60Q on the wafer 60 are identical, the original pattern of these patterns would be centralized, e.g., into a single subfield $SF_{1,2}$ on the mask 50. As a result, the mask 50 in this example is compressed, and the number of subfields $SF_{i,j}$ inside the pattern field 50P is less than the number of transfer subfields $PF_{i,j}$ inside the transfer field 60Q.

In the above configuration, the correlation between the mask subfields $SF_{i,j}$ and the transfer subfields $PF_{i,j}$ on the wafer 60 is input in advance as exposure data to the controller 19 from the input device 24. Then, the deflection amounts for the deflectors 12A, 12B, 13A, 13B, 14A, 14B and the positions of the stages 16, 21 are controlled during exposure so that the pattern image of each mask subfield $SF_{i,j}$ is transferred to a specified location on the wafer 60 according to the exposure data.

In addition, if no more of the mask images can be formed between the mask and the wafer, then the mask stage 16 and the movable stage 21 are continuously moved in opposite directions along the X axis as transferring proceeds. Thus, the field in which the pattern field 50P and transfer field 60Q (shown in FIGS. 2(a)-2(b)) enter into the mask-side optical field Cm and the sensitive substrate-side optical field Cw, respectively, is gradually changing. This enables the pattern images in all of the subfields $SF_{i,j}$ in the pattern field 50P to be transferred to the transfer field 60Q on the wafer 60.

Adjustment of the irradiation position and pattern transfer position of the electron beam EB during continuous movement is performed by the deflectors 12A, 12B, 13A, 13B, 14A, 14B. After transfer of the transfer field is completed, the movable stage 21 is moved by a desired step amount along the Y axis, and transferring to the next transfer field is performed. By repeating this process, the transfer of one die's worth of patterns to the transfer field is accomplished.

A scattering mask or a perforated stencil mask is used in the preferred embodiment. When these masks are used, it may be necessary to divide the pattern in a mask subfield if there are isolated ("island") unexposed patterns. An example of such a division method is shown in FIGS. 7(a)–(e).

Figure 7A:
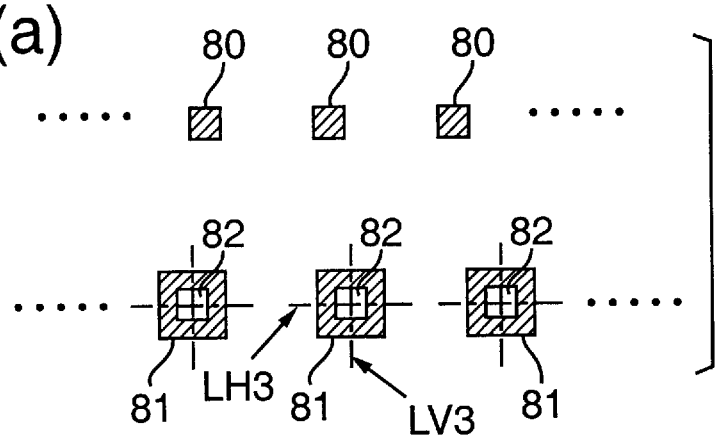
FIGS. 7(a)–7(e) provide explanatory drawings illustrating an example in which an isolated pattern is divided into complementary patterns.

FIG. 7(a) shows part of an example of a pattern being transferred to the wafer 60 in this example, wherein the hatched areas 80, 81 are exposed by the electron beam, and 82 is the "island" unexposed area surrounded by the exposed part 81. In both the case of the scattering mask shown in FIG. 12(a) and the perforated stencil mask shown in FIG. 12(b), in order to transfer the "island" unexposed area 82 to the wafer, it is necessary to furnish a scattering part of a corresponding size. However, in the case of a scattering mask, the perimeter of the scattering part that corresponds with the "island" unexposed part 82 becomes only non-self-supporting thin film. In the case of a perforated stencil mask, the perimeter of the scattering part that corresponds with the "island" unexposed part 82 is surrounded by a void. In the latter case, the scattering part that corresponds with the "island" unexposed part 2 cannot be realized independently.

In order to counter the foregoing problem, an example method is disclosed in which the pattern surrounding the "island" unexposed part 82 is divided into two complementary patterns, and transferring is divided into two passes. In this example method, the "island" unexposed part 82 is formed by a four-pass overlaid exposure.

Figure 7B:
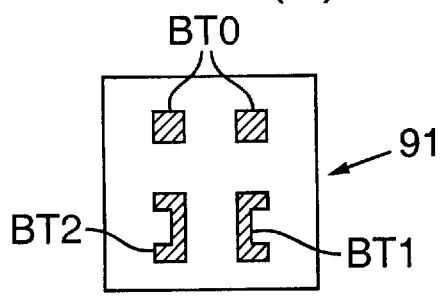
Figure 7C:
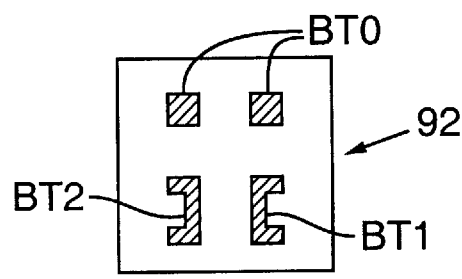
Figure 7D:
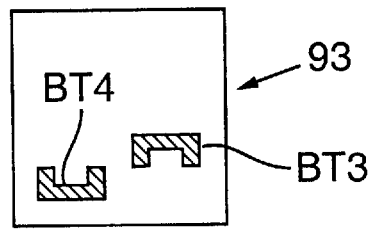
Figure 7E:
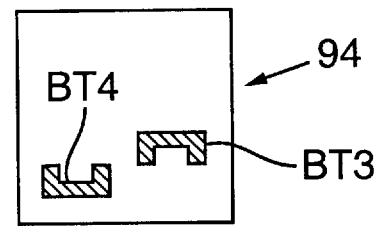

FIGS. 7(b) through (e) show the mask subfields for transferring the pattern in FIG. 7(a), wherein FIG. 7(b) shows the mask subfield 91 used in the first-pass transfer, FIG. 7(c) shows the subfield 92 used in the second-pass transfer, FIG. 7(d) shows the subfield 93 used in the third-pass transfer, and FIG. 7(e) shows the subfield 94 used in the fourth-pass transfer. Electron beam transmitting parts BT0, corresponding to the entire exposed parts 80 on the wafer, and electron beam transmitting parts BT1, BT2 corresponding to the shape of the exposed part 81 divided along the boundary line LV3, are formed in subfields 91 and 92. Meanwhile, electron-beam transmitting parts BT3, BT4, which correspond with the shape of the exposed part 81 divided along the boundary line LH3, are formed in subfields 93 and 94. Subfields 91 through 94 are all the same size.

In the mask furnished with the foregoing mask subfields 91 through 94, the electron-beam dose for one pass is set to approximately half that for a one-shot exposure. The pattern images in mask subfields 91 and 93 are transferred to the same location on the wafer, while the pattern images in the subfields (on the wafer) 92 and 94 are transferred shifted in the lateral direction by half the width of the subfields 91, 93 compared to the pattern images in subfields 91, 93. By transferring the pattern images in subfields 91, 92, the exposed part 81 is transferred to the wafer with boundary line LV3 as the seam, and by transferring the pattern images in subfields 93, 94, the exposed part 81 is transferred to the wafer with boundary line LH3 as the seam.

Since the seam position in the exposed part 81 resulting from the first and second transfer differs from the seam position in the exposed part 81 resulting from the third and fourth overlaid transfer, the distribution of the electron beam dose at the seam positions of the exposed part 81 is smoother. The differences at the seam positions are more suppressed, than when the exposed part 81 is transferred divided simply in two.

The various concrete operations in this example will now be explained in a case where primarily a DRAM pattern is transferred by an electron beam to a wafer.

Figure 3A:
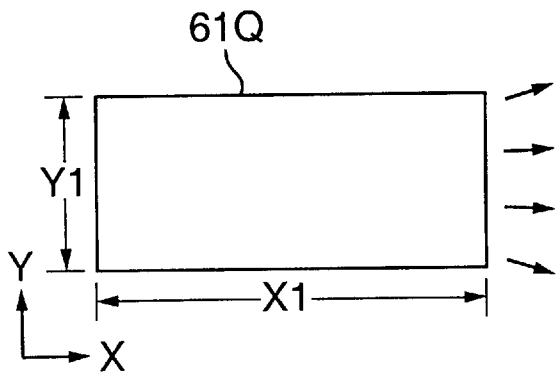
FIG. 3(a) is a plan-view drawing showing an example of one die of a transfer field 61Q on a wafer.
Figure 3B:
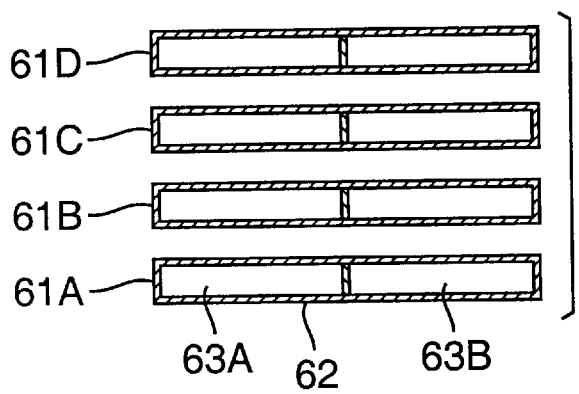
FIG. 3 (b) is a plan-view drawing showing an example in which the transfer field 61Q of FIG. 3(a) is divided into four transfer fields 61A–61D.
FIG. 3(c) is a plan-view drawing showing an example of the mask subfield array, corresponding to the transfer field 61A, inside the pattern field 51P on the mask.

First, a DRAM pattern will be transferred into a one die transfer field 61Q which is X1 wide in the X direction and Y1 wide in the Y direction, as shown in FIG. 3(a), using a perforated stencil mask as the mask 50. As an example, width X1 is 36 mm and width Y1 is 18 mm. In addition, the pattern in the transfer field 61Q is divided into the patterns of a first through fourth transfer fields 61A–61D which are stripe-shaped and symmetrical in the Y direction, as shown in FIG. 3(b). The patterns in these four transfer fields 61A–61D comprise, e.g., a non-repetitious peripheral circuit 62, shown by the hatching at the perimeter, and repetitious memory cells 63A, 63B at the center. Therefore, this example will show transferring patterns by the divided-transfer method applied to the first transfer field 61A, which is strip-shaped, long and narrow in the X direction.

Figure 3C:
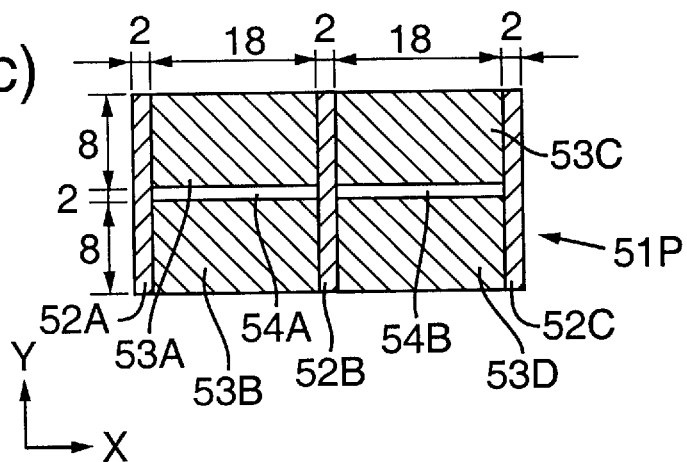

In this case, as shown in FIG. 3(c), the specified pattern field 51P of the mask in the example is divided into 18 lines in the Y direction and 42 columns in the X direction. The original pattern for the non-repetitious peripheral circuit 62 in FIG. 3(b) is allotted to partial pattern fields 52A, 52B and 52C, with each extending two columns in the Y direction, and to four 8 line×8 column rectangular partial pattern fields 53A, 53B, 53C and 53D. Furthermore, the original patterns for the repetitious memory cells 63A, 63B are allotted to 2 line×18 column partial pattern fields 54A and 54B which each extend in the center in the X direction.

Figure 4:
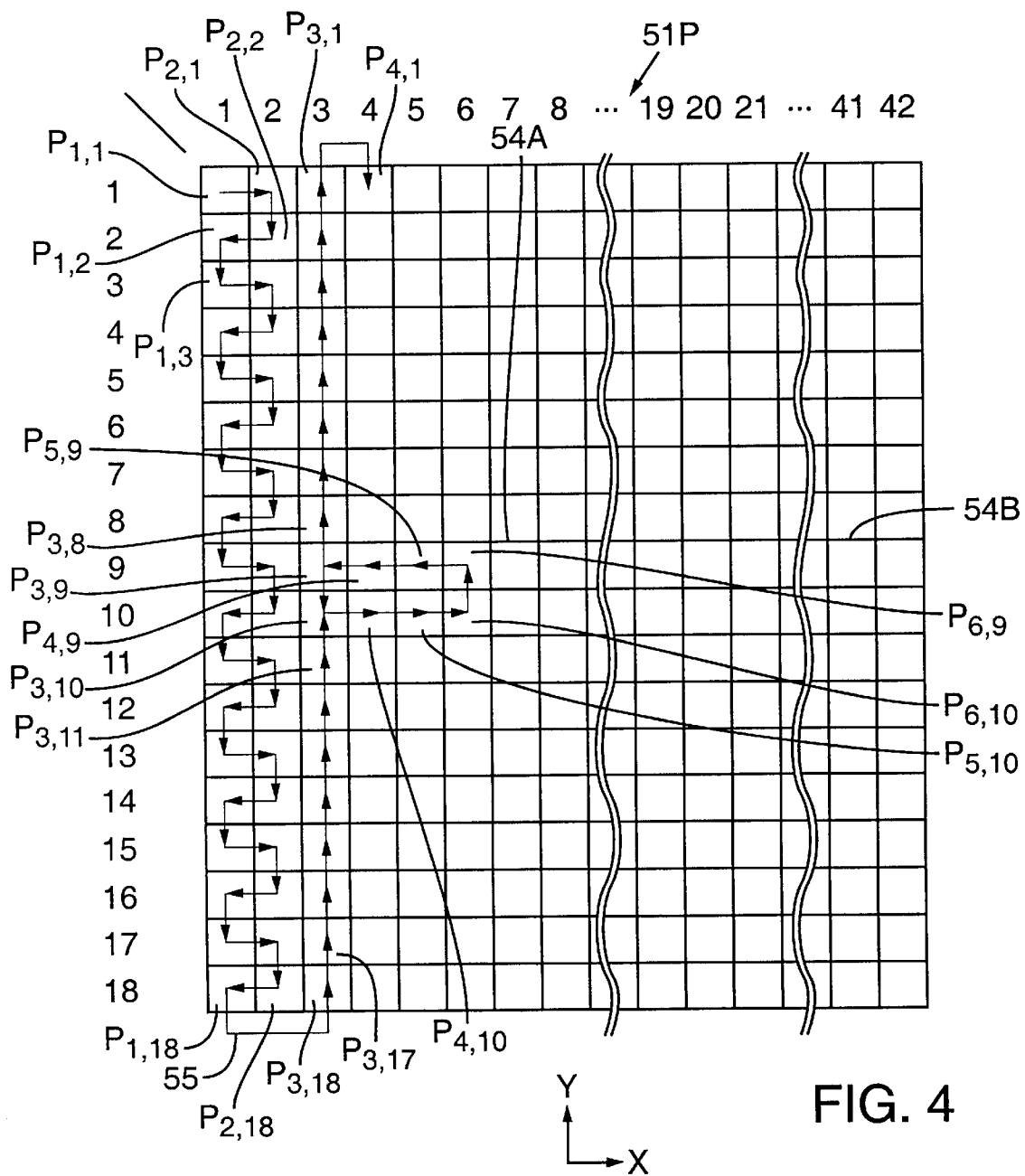
FIG. 4 is an enlarged plan-view drawing showing a portion of the subfield array and transfer sequence on the mask in FIG. 3(c).

FIG. 4 shows the arrangement of the subfields inside the specified pattern field 51P on the mask in FIG. 3(c), wherein the subfield in the $i^{th}$ line in the Y direction and the $j^{th}$ column in the X direction is represented as subfield $P_{j,i}$ (j=1–42; i=1–18). Since a perforated stencil mask is used in this example, complementary patterns are formed in two adjacent mask subfields. For example, the complementary patterns to the subfields $P_{1,1}$–$P_{1,18}$ in the first column are formed in the respective subfields $P_{2,1}$–$P_{2,18}$, while complementary patterns to every other subfield $P_{3,18}$, $P_{3,16}$, ... in the third column are formed in every other respective subfield $P_{3,17}$, $P_{3,15}$, ... Similarly, in the central 2 line×18 column partial pattern field 54A corresponding to the central memory cell 63A, complementary patterns to every other subfield $P_{3,10}$, $P_{5,10}$, $P_{6,9}$, $P_{4,9}$ are formed in every other respective subfield $P_{4,10}$, $P_{6,10}$, $P_{5,9}$, $P_{3,9}$. In addition, in the memory cells, the patterns in subfields $P_{3,10}$, $P_{5,10}$, $P_{6,9}$, and $P_{4,9}$ are identical.

Figure 5:
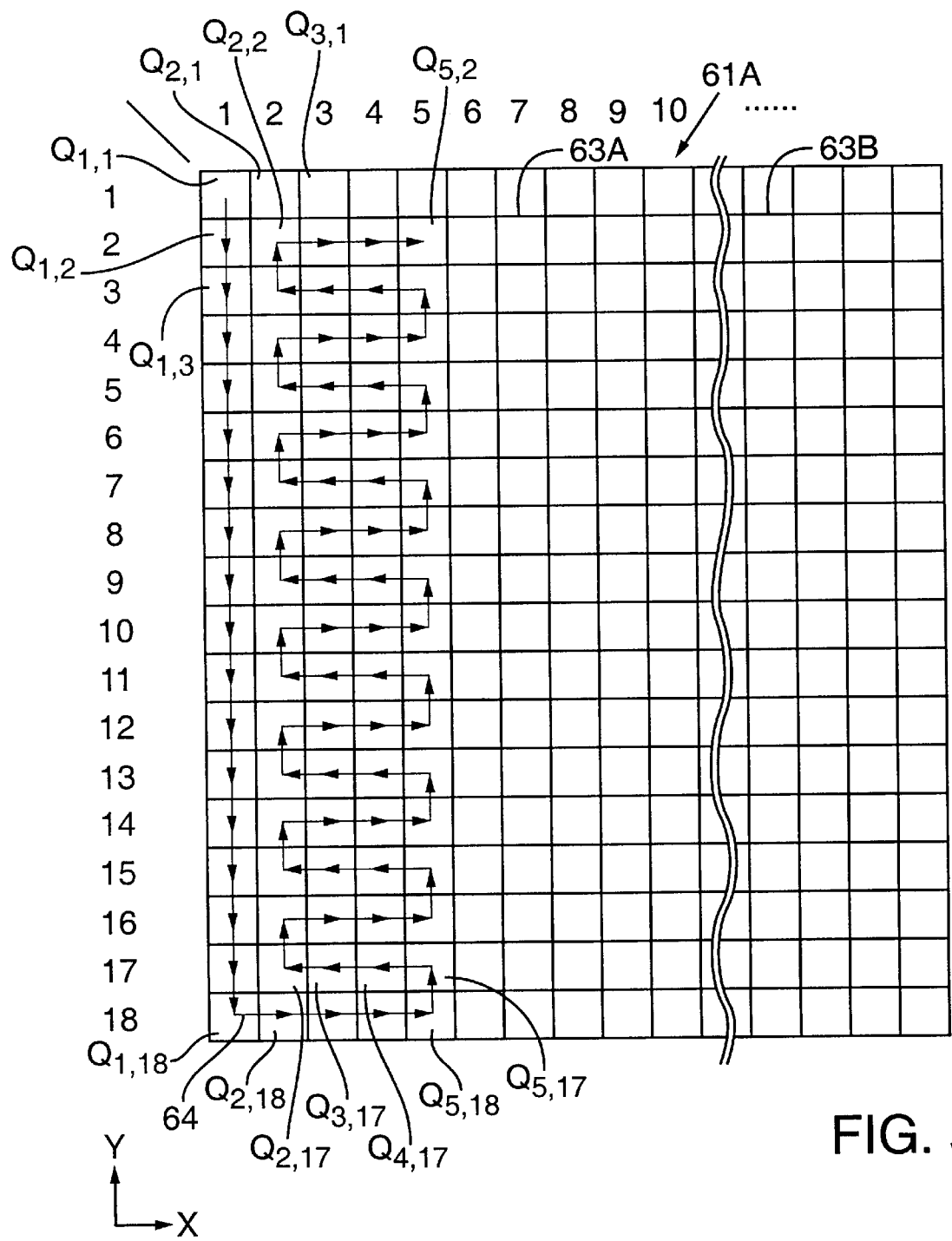
FIG. 5 is an enlarged plan-view drawing showing a portion of the transfer subfield array and transfer sequence inside the transfer field 61A on the wafer in FIG. 3(b).

FIG. 5 shows the arrangement of the transfer subfields inside the first transfer field 61A on the wafer in FIG. 3(b), wherein, the transfer subfield in the $i^{th}$ line in the Y direction and the $j^{th}$ column in the X direction is represented as transfer subfield $Q_{j,i}$ (j=1–42; i=1–18). In this case, the identical pattern is transferred to the transfer subfields $Q_{j,i}$ in the second through seventeenth lines of the central memory cells 63A, 63B.

Based on this kind of mask subfield and transfer subfield arrangement, the field-selection deflectors 12A, 12B and the deflectors 13A, 13B, 14A, 14B are driven in a preselected sequence to deflect the electron beam. Transferring starts first in the specified pattern field 51P of the mask, beginning with the pattern in the upper-left subfield $P_{1,1}$, and thereafter sequentially transferring by moving the patterns of two columns of subfields in the −Y direction: mask subfield $P_{1,1}$, $P_{2,1}$, $P_{2,2}$, ..., $P_{2,18}$, $P_{1,18}$. At this time, complementary patterns, e.g., as in mask subfields $P_{1,1}$ and $P_{2,1}$, are transferred to the same transfer subfield $Q_{1,1}$ on the wafer. In the transfer field 61A on the wafer side, transferring starts from the upper-left transfer subfield $Q_{1,1}$ and thereafter proceeds sequentially in the −Y direction for the first column of transfer subfields $Q_{1,2}$, $Q_{1,2}$, ..., $Q_{1,18}$, as shown by the path 64 in FIG. 5.

Subsequently, on the mask side (FIG. 4), the patterns are transferred from the subfields $P_{3,18}$, $P_{3,17}$, ..., $P_{3,11}$ in the third column, moving in the +Y direction, as shown in FIG. 4. On the wafer side (FIG. 5), the transfer subfields $Q_{2,18}$, ..., $Q_{5,18}$ in the 18th line are sequentially transferred in the +X direction. Then, in the memory-cell portion, the central eight subfields $P_{3,10}$, $P_{4,10}$, $P_{5,10}$, $P_{6,10}$, $P_{6,9}$, $P_{5,9}$, $P_{4,9}$, $P_{3,9}$, on the mask side are repetitively and sequentially transferred in the +X direction and/or the −X direction, as shown in FIG. 4. On the wafer side, the subfields $Q_{5,17}$, ..., $Q_{2,17}$ in the seventeenth line through the subfields $Q_{2,2}$, ..., $Q_{5,2}$ in the second line are sequentially transferred to in the −X direction and/or +X direction. After this, the patterns on the mask side in the subfields $P_{3,8}$–$P_{3,1}$ in the third column are sequentially transferred in the +Y direction, as shown in FIG. 4, and transfer is performed into the corresponding transfer subfields on the wafer side. Thereafter, the pattern images in all the subfields in the specified pattern field 51P on the mask are similarly transferred to corresponding transfer subfields in the specified pattern field 61A on the wafer.

Figure 6:
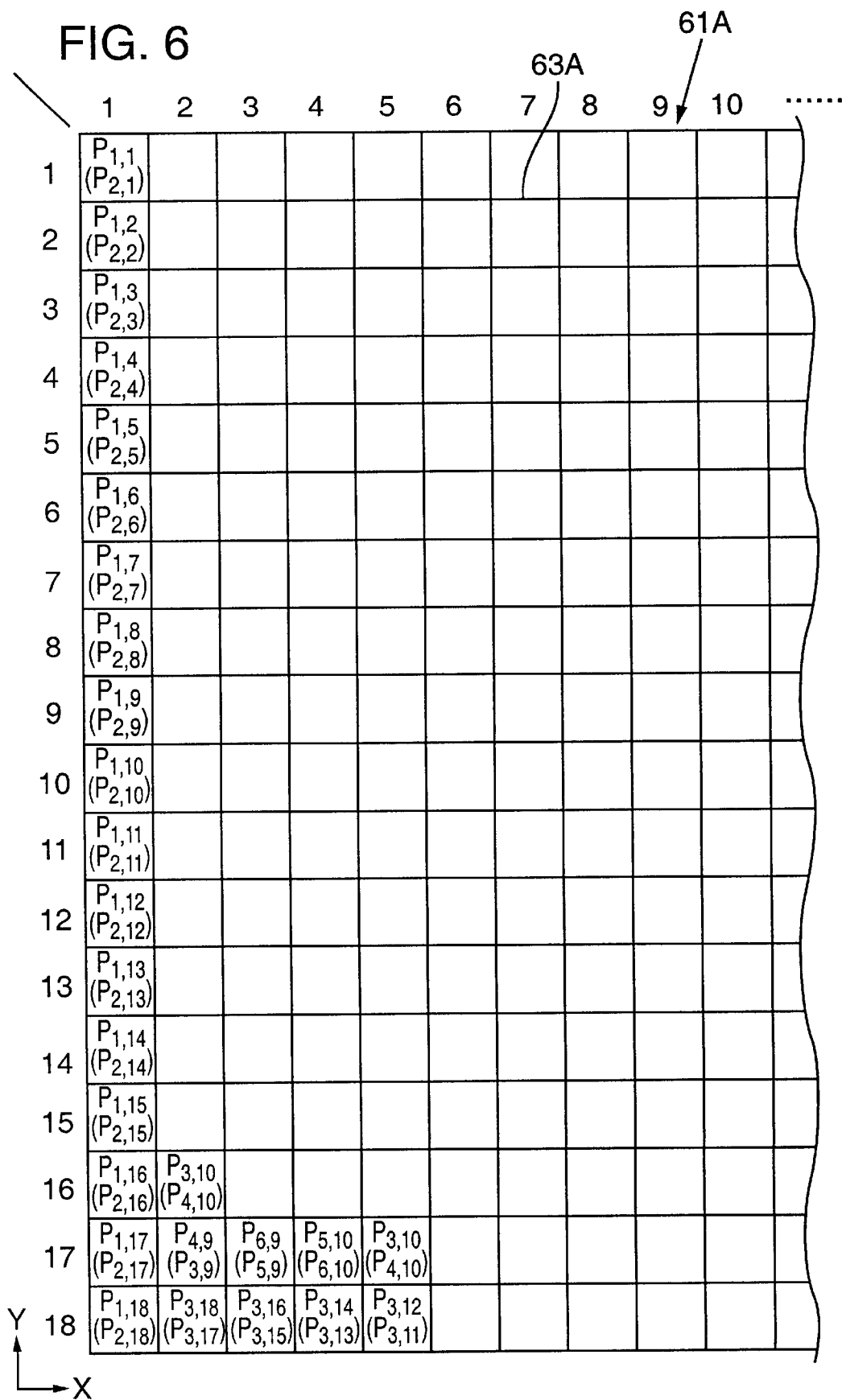
FIG. 6 is an enlarged plan-view drawing showing the patterns in the mask subfield that are transferred into the various transfer subfields on the wafer in FIG. 5.

As a result of the foregoing, the complementary patterns in each pair of subfields on the, mask in FIG. 4 are transferred to each transfer subfield in the transfer field 61A on the wafer, as shown in FIG. 6. In FIG. 6, for the sake of simplicity, the reduced image of the pattern in subfield $P_{i,j}$ in FIG. 4 is represented by $P_{j,i}$. For example, the complementary patterns of subfields $P_{1,1}$ and $P_{2,1}$, the complementary patterns of subfields $P_{1,2}$ and $P_{2,2}$, . . . are sequentially transferred into the first column of transfer subfields in the transfer field 61A, while the complementary patterns of subfields $P_{3,10}$ and $P_{4,10}$, the complementary patterns of subfields $P_{5,10}$ and $P_{6,10}$, . . . are sequentially transferred into the transfer subfields in the memory cell 61A.

In this example, as shown by the path 55 in FIG. 4 and the path 64 in FIG. 5, the space between consecutive subfields being transferred $P_{j,i}$, or transfer subfields $Q_{j,i}$, normally is within the width of each single subfield $P_{j,i}$ or transfer subfield $Q_{j,i}$. Consequently, exposure normally can be efficiently accomplished with no decrease in throughput, without the amount of deflection by the field selection deflectors 12A, 12B and the deflectors 13A, 13B, 14A, 14B in FIG. 1 being large jumps.

According to computer simulations performed with this example, when the scattering film in the mask subfield $P_{i,j}$ in FIG. 4 is irradiated for 30 μsec at 100 μA irradiation current, it was found that the temperature of the mask subfield $P_{j,i}$ increases immediately after irradiation. However, as the continuously arranged mask subfields are sequentially irradiated, the temperatures of the mask subfields which were irradiated several units previously decrease to nearly the same temperature as before irradiation. Consequently, by cyclically irradiating the eight subfields $P_{3,10}$, $P_{4,10}$, $P_{5,10}$, $P_{6,10}$, $P_{6,9}$, $P_{5,9}$, $P_{4,9}$, $P_{3,9}$ in the identical pattern (actually there are two patterns, considering complementary patterns) inside the specified pattern field 51P of the mask, as shown in FIG. 4, it is possible to prevent decreases in accuracy caused by thermal expansion of the mask subfields.

Figure 8:
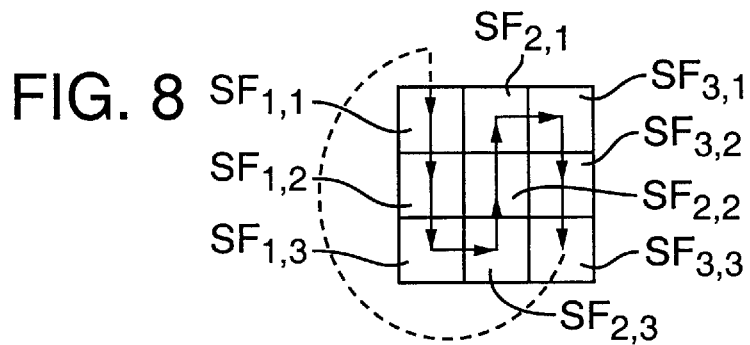
FIG. 8 is an explanatory drawing in which a 3 line×3 column grid of subfields is cyclically and repeatedly exposed by an electron beam.

In this example, each mask subfield on the mask must be irradiated with the electron beam for, e.g., 80 μsec. However, temperature increases can be minimized if the irradiation time at each mask subfield is 30 μsec or less. Shorter irradiation times can be achieved by providing mask patterns that are identical to the original single mask subfield pattern but which are formed in, e.g., 9 subfields $SF_{1,1}$, $SF_{1,2}$, ..., $SF_{3,2}$, $SF_{3,3}$ arranged in a 3 line×3 column grid on the mask, as shown in FIG. 8. By driving the field-selection deflectors 12A, 12B and the deflectors 13A, 13B, 14A, 14B in FIG. 1 to scan the electron beam, these nine subfields $SF_{1,1}$–$SF_{3,3}$ are cyclically and repeatedly irradiated three times, as shown in FIG. 8. When this is done, transfer is repeated to the same single transfer subfield on the wafer, and the first and second pass is irradiated from 30 μsec each, while the third pass is irradiated for 20 μsec.

In addition, the deflection in the subfields within this 3 line×3 column range is preferably performed by electrostatic deflection. With an electrostatic deflecting system, deflection in this size range would take several tens of volts or less, and deflection could be accomplished with a settling time of several 100 nsec or less. If electromagnetic deflection were used, around 10 to 100 μsec would normally be required. Thus, transfer can be accomplished while suppressing temperature increases in each subfield on the mask and without any drop in throughput. In addition, since a compressed mask is used in this example, even if the number of subfields is increased in this way, the number of subfields overall can be vastly decreased compared, e.g., to the number of transfer subfields on the wafer.

In the embodiment described in FIG. 2(a), the specified pattern field 50P on the mask is divided by boundary fields BF at a constant pitch into mask subfields $SF_{1,1}$, $SF_{1,2}$, ... of the same size. However, there are instances in which the several patterns formed by repetition of certain patterns of different pitch are intermixed inside a one-die transfer field on the wafer.

Figure 9A:
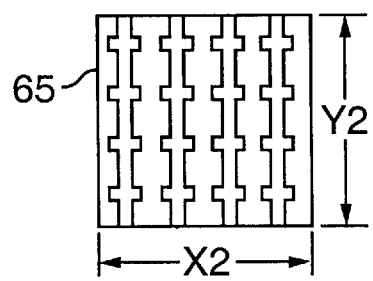
FIGS. 9(a)–9(b) illustrate respective examples of two patterns having different repetition pitches.
Figure 9B:
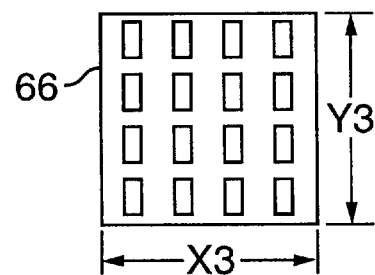

For example, as shown in FIG. 9, a pattern in which two patterns 65 and 66 are repeated exists on one die on the wafer. FIG. 9(a) is a pattern 65 having widths X2 and Y2, which is X2 wide in the X direction and Y2 wide in the Y direction, e.g., 200 μm and 230 μm, respectively. FIG. 9(b) is a pattern 66 in which the widths X3 and Y3 are X3 wide in the X direction and Y3 wide in the Y direction, e.g., 180 μm and 240 μm, respectively. In this case, where the widest width is Y3, and the reduction ratio from the mask to the wafer is β, several mask subfields $SF_{1,1}$, $SF_{1,2}$, . . . on the mask in FIG. 2(a) would be formed as Y3/β wide squares (in this case, 240/β μm squares). The patterns inside these mask subfields $SF_{1,1}$, $SF_{1,2}$, . . . would be the original pattern 65 in FIG. 9(a) or the original pattern 66 in FIG. 9(b). Then, when the patterns in these subfields are transferred to the wafer, each pattern would be transferred positioned in alignment with its respective pitch.

In this manner, various patterns can be formed on the mask without changing the size of the boundary field grid on the mask. Consequently, there is also no problem if the size of the irradiation beam onto the subfields on the mask is also constant. This principle can be applied not only to repeating patterns, but also to non-repetitious peripheral circuit patterns. Since the latter is non-repetitious, the pattern could be divided so that the easily divided parts of the pattern form the boundary of the mask subfields.

Furthermore, when a perforated stencil mask is used as the mask, as described above, the original pattern for one transfer subfield on the wafer may be divided into two complementary mask subfields.

Figure 10A:
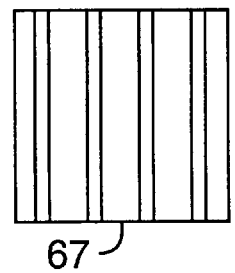
Figure 10B:
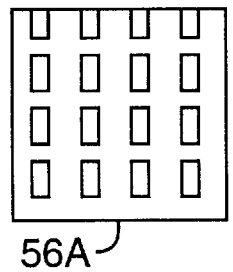
Figure 10B:
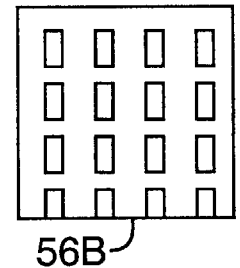
Figure 10D:
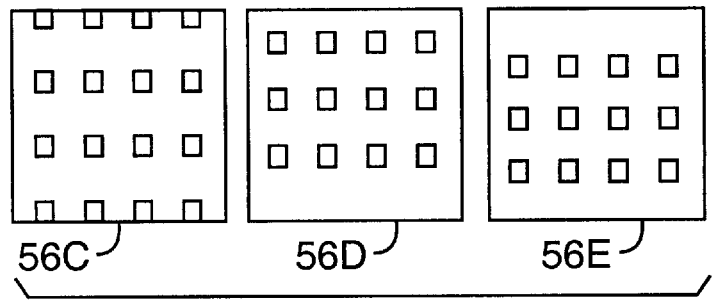
Figure 11:
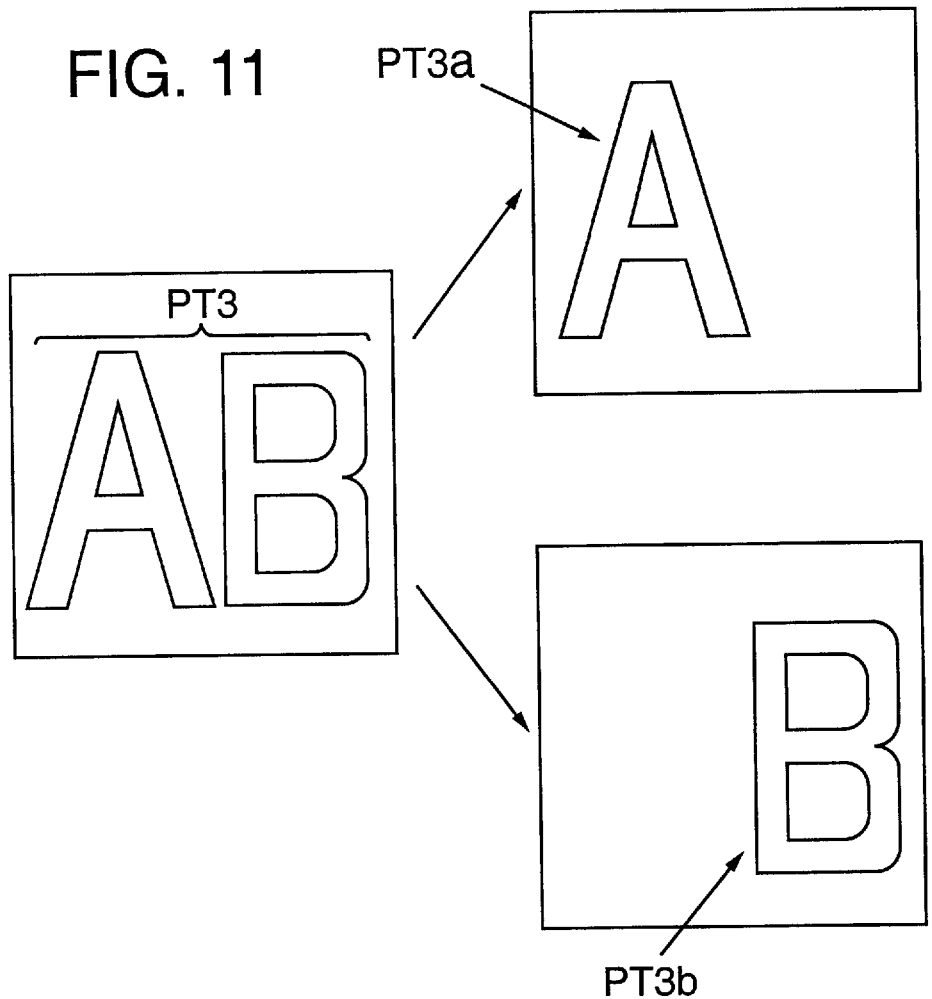
FIG. 11 is an explanatory illustration of a pattern that is to be transferred into a single transfer subfield on a wafer from divided, multiple mask subfields.

FIGS. 10(a)–10(d) show an example of this division, wherein the original pattern in the single transfer subfield on the wafer in FIG. 10(a) is divided into the complementary pattern in one subfield 56A in FIG. 10(b) and the complementary pattern in another subfield 56B in FIG. 10(c). However, if the current intensity irradiated onto the wafer by the complementary pattern in mask subfield 56A in FIG. 10(b) is too great, the pattern may blur due to the Coulomb effect. As a counter-measure in this kind of situation, the original pattern in the transfer subfield 67 in FIG. 10(*a*) may be divided in three, to provide a set of complementary patterns in three mask subfields 56C–56E, as shown in FIG. 10(*d*). The patterns in these three mask subfields 56C–56E would be transferred into the same, single transfer subfield on the wafer. In this manner, the irradiation current onto the wafer from each subfield 56C–56E decreases, and the Coulomb-effect blurring can be prevented. Although dividing the pattern into three may increase the number of mask subfields, a subfield compression system will prevent the mask from becoming too large.

Blurring of the pattern image due to the Coulomb effect may also occur when a single pattern (such as the Pattern AB in FIG. 11) is transferred. In order to avoid blurring of this kind of pattern, a method is provided in which the pattern PT3, which is being transferred to a single transfer subfield, is laterally divided into two patterns PT3*a* and PT3*b*, situated in different mask subfields. Coulomb-effect blurring can be further decreased by dividing the pattern PT3, for example, into three or more sub-patterns. In this explanation, the X axes of the wafer stage and the mask stage are assumed to be parallel. However, because of the existence of optical components between the mask and the wafer, the image and deflection direction are rotated. Thus, these X axes are not parallel.

ADVANTAGES OF THE INVENTION

The electron beam transfer method of this invention, when transferring by the divided transfer method using a compressed mask, can shorten the spacing between continuously transferred subfields on a mask. This enables throughput to be improved while maintaining transfer position accuracy.

Moreover, when performing transferring by the divided transfer method, irradiating only a specific subfield on the mask with the charged particle beam for a long period of time can be prevented, enabling the positioning accuracy of the pattern being transferred to be maintained at a high level.

Moreover, when performing transferring by the divided transfer method, deflection of the charged particle beam can be performed at high speeds when cyclically transferring the patterns in multiple adjacent subfields on the mask, and deflection of the charged particle beam can be performed with high accuracy between separated subfields.

When performing transferring by the divided transfer method using a compressed mask, patterns can be compressed using mask subfields of a common size on the mask. Even with multiple types of cyclical patterns with different repetition pitches on the sensitive substrate, the number of mask subfields does not become impossibly large.

Finally, when performing transferring by the divided transfer method, mask subfields in which the irradiation amount by the charged particle beam is especially great can be eliminated. It is therefore possible to avoid image blurring due to the Coulomb effect, without significantly decreasing throughput.

It will be understood that the examples and embodiments disclosed above are intended to merely illustrate the best mode now known for practicing the invention. The scope of the invention is not to be considered limited thereto.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A charged particle beam transfer method comprising the steps of:

(a) providing a pattern which is to be transferred to a specified range on a sensitive substrate, wherein the pattern is formed with at least part of the pattern divided into multiple subfields separated from one another on a mask;

(b) irradiating a charged particle beam onto the mask using the mask subfields as irradiation units, at which time multiple irradiations are performed on at least one of the mask subfields so as to transfer the patterns in the multiple different transfer subfields onto individual transfer subfields on the sensitive substrate, and in which transferred in a specified range on the sensitive substrate by adjusting the pattern transfer position on the sensitive substrate so that the transfer subfields, corresponding with the mask subfields, touch each other on the sensitive substrate;

(c) wherein the charged particle beam is sequentially irradiated on multiple mask subfields that are arrayed along a first array dimension to sequentially transfer the mask subfields to transfer subfields on the sensitive substrate along the first array dimension, and which also sequentially transfers multiple mask subfields sequentially arranged along a second array dimension perpendicular to the first array dimension;

(d) wherein at least one subfield on the mask is transferred to multiple subfields on the sensitized substrate through repeated exposure of the at least one subfield on the mask thereby allowing for a compressed mask.

2. The charged particle beam transfer method of claim 1, wherein the mask subfields are arrayed in a single line of mask fields.

3. The charged particle beam transfer method of claim 2, wherein the single line of mask fields is a single column or a single row.

4. The charged particle beam transfer method of claim 1, wherein the mask subfields are arrayed in multiple lines.

5. The charged particle beam transfer method of claim 4, wherein the multiple lines of mask subfields are multiple columns or multiple rows.

6. The charged particle beam transfer method of claim 1, further comprising the step of repeatedly sequentially irradiating multiple mask subfields with the charged particle beam.

7. A charged particle beam transfer method in which a pattern which is to be transferred to a specified range on a sensitive substrate is formed with at least part of the pattern divided into multiple mask subfields separated from one another on a mask, the method comprising the steps of:

(a) repeatedly irradiating a charged particle beam onto the mask using the mask subfields as irradiation units, such that a desired pattern is transferred in a specified range on the sensitive substrate by adjusting the pattern transfer position on the sensitive substrate so that the multiple transfer subfields on the sensitive substrate which correspond with the multiple mask subfields touch each other on the sensitive substrate;

(b) wherein at least some of the multiple mask subfields are arrayed within a region on the mask within which region the mask subfields are sequentially and cyclically irradiated multiple times with a charged particle beam to sequentially transfer a pattern defined in the region onto a larger number of transfer subfields on the sensitive substrate than the number of mask subfields within the region on the mask.

8. The charged particle beam transfer method of claim 7, wherein the step of sequentially and cyclically irradiating the mask subfields within the region on the mask comprises deflecting the particle beam electrostatically within the region.

9. The charged particle beam transfer method of claim 8, further comprising the step of deflecting the particle beam electromagnetically outside the region on the mask.

10. A charged particle beam transfer method for transferring a pattern to a specified range on a sensitive substrate, the method comprising the steps of:
(a) providing a mask with multiple mask subfields separated from one another;
(b) irradiating a charged particle beam onto the mask in a desired pattern to transfer a specified range of mask subfields to corresponding transfer subfields on the sensitive substrate, while adjusting the pattern transfer position so that the multiple transfer subfields on the sensitive substrate which correspond with the multiple mask subfields touch each other on the sensitive substrate; and
(c) repeatedly irradiating at least one subfield on the mask multiple times to expose multiple transfer subfields on the sensitized substrate, the charged particle beam being deflected by an electrostatic deflecting system within the region, while using an electromagnetic deflecting system to deflect the charged particle beam outside the region.

11. The charged particle beam transfer method of claim 10, wherein the step of irradiating the charged particle beam onto the mask comprises sequentially moving the beam in a first direction to transfer a first array of transfer subfields, then moving the beam in a second direction, perpendicular to the first direction, to transfer a second array of transfer subfields.

12. A charged particle beam transfer method comprising the steps of:
(a) providing a pattern which is to be transferred to a specified range on a sensitive substrate, wherein at least part of the pattern is divided into multiple complementary subfields separated from one another on a mask, wherein at least some of the complementary mask subfields, when sequentially exposed onto a transfer subfield, form a complete image when combined with each other on the transfer subfield; and
(b) repeatedly irradiating a charged particle beam onto the mask using the complementary subfields on the mask as irradiation units, and transferring a desired pattern onto corresponding transfer subfields in a specified range on the sensitive substrate by exposing multiple complementary mask subfields onto at least one transfer subfield and by adjusting a pattern transfer position on the sensitive substrate so that multiple transfer subfields on the sensitive substrate, corresponding with the multiple subfields on the mask, touch each other on the sensitive substrate;
(c) wherein at least one subfield on the mask is transferred to multiple subfields on the sensitized substrate through repeated exposure of the at least one subfield on the mask.

13. The charged particle beam transfer method of claim 12, further comprising the step of providing boundary fields surrounding each of the multiple subfields on the mask, and regularly arraying the boundary fields in a grid pattern.

14. A charged particle beam transfer method, comprising the steps of:
(a) providing a pattern that is to be transferred to a specified range on a sensitive substrate, wherein the pattern is formed with at least part of it divided into multiple mask subfields separated from one another on a mask;
(b) repeatedly irradiating a charged particle beam onto the mask using the mask subfields as irradiation units, and transferring a desired pattern in a specified range on the sensitive substrate by adjusting the pattern transfer position on the sensitive substrate so that multiple transfer subfields on the sensitive substrate, which correspond with the multiple mask subfields, touch each other on the sensitive substrate; and
(c) whenever a charged particle beam irradiation amount onto the aforementioned sensitive substrate in the transfer subfield exceeds a desired amount, distributing a pattern of a single transfer field as complementary patterns in two or more mask subfields, so that the irradiation amount does not exceed the aforementioned desired amount, and these divided subfields are overlaid on individual corresponding transfer subfields on the sensitive substrate during transfer;
(d) wherein at least one subfield on the mask is transferred to multiple subfields on the sensitized substrate through repeated exposure of the at least one subfield on the mask.

15. The charged particle beam transfer method of claim 14, wherein step (b) comprises sequentially irradiating a plurality of mask subfields in a row, and transferring the images of the sequentially irradiated plurality of mask subfields in the row to a single transfer subfield.

16. The charged particle beam transfer method of claim 14, wherein step (b) comprises sequentially irradiating a plurality of mask subfields in a column, and transferring the images of the sequentially irradiated plurality of mask subfields in the column to a single transfer subfield.

17. The charged particle beam transfer method of claim 14, wherein step (b) comprises sequentially irradiating a plurality of mask subfields in a row, and transferring the images of the sequentially irradiated plurality of mask subfields in the row to a single transfer subfield, and sequentially irradiating a plurality of mask subfields in a column, and transferring the images of the sequentially irradiated plurality of mask subfields in the column to a single transfer subfield.

18. The charged particle beam transfer method of claim 14, wherein step (a) comprises providing multiple complementary mask subfields which are to be transferred to a single transfer subfield to form a complete image.

19. The charged particle beam transfer method of claim 18, wherein the multiple complementary mask subfields are provided within a region on the mask, and are sequentially and cyclically irradiated multiple times to transfer a repeating pattern to the substrate while avoiding thermal expansion of the mask subfields.

20. The charged particle beam transfer method of claim 19, wherein the step of sequentially and cyclically irradiating the multiple mask subfields within a region on the mask comprises deflecting the particle beam electrostatically within the region.

21. A charged particle beam transfer method in which a pattern which is to be transferred to a specified range on a sensitive substrate is formed with at least part of the pattern divided into multiple mask subfields separated from one another on a mask, the method comprising the steps of:

(a) providing boundary fields surrounding each of the multiple subfields on the mask, the boundary fields being regularly arranged in a grid pattern on the mask, the pattern range in each subfield being positioned individually for each subfield;

(b) repeatedly irradiating a charged particle beam onto the mask using the mask subfields as irradiation units, such that a desired pattern is transferred in a specified range on the sensitive substrate by adjusting the pattern transfer position on the sensitive substrate so that the multiple transfer subfields on the sensitive substrate which correspond with the multiple mask subfields touch each other on the sensitive substrate, the multiple transfer fields corresponding to multiple mask subfields being transferred to arbitrary positions on the specified range on the sensitive substrate.

* * * * *

UNITED STATES PATENT AND TRADEMARK OFFICE
CERTIFICATE OF CORRECTION

PATENT NO. : 5,874,198

DATED : February 23, 1999

INVENTOR(S) : TERUAKI OKINO

It is certified that error appears in the above-identified patent and that said Letters Patent is hereby corrected as shown below:

On the title page item [57],

Line 24 of the Abstract, "from" should be --form--.

Column 5, line 57, "($SF_{1,1}$, $SF_{1,21}$, . . .)" should be --($SF_{1,1}$, $SF_{1,2}$, . . .)--.

Column 6, lines 54 and 55, "($SF_{1,1}$, $SF_{1,2}$, . . .)" should be
--($PF_{1,1}$, $PF_{1,2}$, . . .)--.

Column 7, line 4, "Y3xY3" should be --X3 x Y3--.

Column 7, line 43, the comma "," after "blurring" should be a period --.--.

Column 7, line 56, after "drawing" and before "certain" insert --showing--.

Column 12, line 14, "strip-shaped" should be --stripe-shaped--.

UNITED STATES PATENT AND TRADEMARK OFFICE
CERTIFICATE OF CORRECTION

PATENT NO. : 5,874,198

DATED : February 23, 1999

INVENTOR(S) : TERUAKI OKINO

It is certified that error appears in the above-identified patent and that said Letters Patent is hereby corrected as shown below:

Column 12, line 66, "$Q_{1,2}, Q_{1,2}, \ldots, Q_{1,18}$" should be --$Q_{1,1}, Q_{1,2}, \ldots, Q_{1,18}$--.

Column 14, line 6, "from" should be --for--.

Signed and Sealed this

Seventh Day of December, 1999

Q. TODD DICKINSON

Attest:

Attesting Officer

Acting Commissioner of Patents and Trademarks